(12) United States Patent
Jeong

(10) Patent No.: US 12,154,887 B2
(45) Date of Patent: *Nov. 26, 2024

(54) MEMORY DEVICE AND PREPARATION METHOD THEREOF

(71) Applicant: WUHAN XINXIN SEMICONDUCTOR MANUFACTURING CO., LTD., Wuhan (CN)

(72) Inventor: Jongbae Jeong, Wuhan (CN)

( * ) Notice: Subject to any disclaimer, the term of this patent is extended or adjusted under 35 U.S.C. 154(b) by 100 days.

This patent is subject to a terminal disclaimer.

(21) Appl. No.: 17/542,419

(22) Filed: Dec. 5, 2021

(65) Prior Publication Data

US 2023/0097501 A1    Mar. 30, 2023

(30) Foreign Application Priority Data

Sep. 30, 2021   (CN) .......................... 202111160766.2

(51) Int. Cl.
 *H01L 25/065*   (2023.01)
 *H01L 25/00*   (2006.01)
 *H01L 25/18*   (2023.01)

(52) U.S. Cl.
 CPC .......... *H01L 25/0657* (2013.01); *H01L 25/18* (2013.01); *H01L 25/50* (2013.01)

(58) Field of Classification Search
 CPC ..... H01L 25/0657; H01L 25/50; H01L 25/18; H10B 80/00
 See application file for complete search history.

(56) References Cited

U.S. PATENT DOCUMENTS

| | | | |
|---|---|---|---|
| 9,508,430 B2 | 11/2016 | Murooka | |
| 10,439,002 B2 | 10/2019 | Murooka | |
| 10,686,012 B2 | 6/2020 | Murooka | |
| 11,844,210 B2* | 12/2023 | Jeong | ....................... G11C 7/18 |
| 2021/0074342 A1* | 3/2021 | Tsuji | ...................... G11C 7/227 |
| 2021/0151465 A1* | 5/2021 | Tagami | .............. H01L 25/0657 |

FOREIGN PATENT DOCUMENTS

TW            657445 B        4/2019

OTHER PUBLICATIONS

Notification to Grant Patent Right for Invention issued in corresponding Taiwan Patent Application No. 110145759dated Jul. 13, 2022, pp. 1-4.

* cited by examiner

*Primary Examiner* — Timor Karimy

(57) ABSTRACT

A memory device includes a first chip and a second chip. The first chip includes a first storage array and a second storage array. The first storage array includes at least one first storage block. The first storage block includes a plurality of first word lines extending in a first direction and a plurality of first bit lines extending in a second direction. The second storage array includes at least one second storage block. By constructing a first global bit line sub-decoder block in a first overhead projection area formed by the first storage block and constructing a second global bit line sub-decoder block in a second overhead projection area formed by the second storage block, an occupied area of the first chip and the second chip after stacking can be reduced, which reduces an occupied area of the memory device and is beneficial for minimizing the memory device.

18 Claims, 9 Drawing Sheets constructing a first storage array and a second storage array on a first chip; the first storage array comprises at least one first storage block, the first storage block comprises a plurality of first word lines extending along a first direction and a plurality of first bit lines extending along a second direction; the second storage array comprises at least one second storage block, and the second storage block comprises a plurality of second word lines extending along the first direction and a plurality of second bit lines extending along the second direction;

—S10 constructing a logic control circuit on a second chip; the logic control circuit comprises a first global bit line sub-decoder and a second global bit line sub-decoder; the first global bit line sub-decoder is electrically connected to the at least one first storage block, the second global bit line sub-decoder is electrically connected to the at least one second storage block, and the second chip has a first overhead projection area of the first storage block and a second overhead projection area of the second storage block; a first global bit line sub-decoder block formed by the first global bit line sub-decoder is located in the first overhead projection area, a second global bit line sub-decoder block formed by the second global bit line sub-decoder is located in the second overhead projection area; and in the second direction, the second overhead projection area and the first overhead projection area are arranged in sequence;

—S20 stacking the second chip above the first chip in a third direction

MEMORY DEVICE AND PREPARATION METHOD THEREOF

1. FIELD OF DISCLOSURE

The present application relates to a field of storage technology, and in particular to a memory device and a preparation method thereof.

2. DESCRIPTION OF RELATED ART

As shown in FIG. 1, a memory device in traditional technical solution includes multiple storage blocks 510, multiple local bit line decoders 520, multiple word line decoders 540, multiple global bit line decoders 530, and other circuit 550, wherein a construction area of a storage block 510, a construction area of a local bit line decoder 520, a construction area of a word line decoder 540, a construction area of a global bit line decoder 530, and a construction area of the other circuit 550 do not overlap each other. For example, the construction area of the local bit line decoder 520 is located at one side of the construction area of a corresponding storage block 510, the construction area of the word line decoder 540 is located at another side of the construction area of a corresponding local bit line decoder 520 and/or the construction area of the storage block 510, and the construction area of the global bit line decoder 530 is located between the construction area of a corresponding local bit line decoder 520 and the construction area of the global bit line decoder 530.

Specifically, as shown in FIG. 2, along a certain direction, the storage block 510 and the local bit line decoder 520 are alternately arranged in sequence, and a last local bit line decoder 520 is followed by the global bit line decoder 530 and multiple sensing amplifiers 551. The word line decoder 540 is disposed on another side of each storage block 510, and each local bit line decoder 520 is electrically connected to a corresponding storage block 510 and the global bit line decoder 530. An output terminal of the global bit line decoder 530 is electrically connected to a plurality of corresponding sensing amplifiers 551. Similarly, the construction area of each storage block 510, the construction area of each local bit line decoder 520, the construction area of the global bit line decoder 530, a construction area of each sensing amplifier 551, and the construction area of each word line decoder 540 in FIG. 2 do not overlap with each other, either.

In this way, the memory device in the above-mentioned traditional technical solution needs to occupy a large space to integrate the above-mentioned parts, which is not conducive to minimizing a size of the memory device.

It should be noted that the above introduction of background technology is only to facilitate a clear and complete understanding of the technical solutions of the present application. Therefore, it cannot be considered that the above-mentioned technical solutions involved are known to those skilled in the art just because it appears in the background art of the present application.

SUMMARY

The present application provides a memory device and a preparation method thereof to alleviate a technical problem that the memory device needs to occupy a large area.

In a first aspect, the present application provides a memory device, which includes a first chip and a second chip. The first chip includes a first storage array and a second storage array. The first storage array includes at least one first storage block, and the first storage block includes a plurality of first word lines extending along a first direction and a plurality of first bit lines extending along a second direction. The second storage array includes at least one second storage block, and the second storage block includes a plurality of second word lines extending along the first direction and a plurality of second bit lines extending along the second direction. The second chip is stacked above the first chip in a third direction, the second chip includes a logic control circuit, and the logic control circuit includes a first global bit line sub-decoder and a second global bit line sub-decoder. The first global bit line sub-decoder is electrically connected to the at least one first storage block, and the second global bit line sub-decoder is electrically connected to the at least one second storage block. The second chip has a first overhead projection area of the first storage block and a second overhead projection area of the second storage block. A first global bit line sub-decoder block formed by the first global bit line sub-decoder is located in the first overhead projection area, and a second global bit line sub-decoder block formed by the second global bit line sub-decoder is located in the second overhead projection area. In the second direction, the second overhead projection area and the first overhead projection area are sequentially arranged.

In some of the embodiments, in the second direction, the first overhead projection area and the second overhead projection area are adjacent to each other.

In some of the embodiments, in the first direction, a length of the first global bit line sub-decoder block is less than or equal to a length of the first overhead projection area. In the first direction, a length of the second global bit line sub-decoder block is less than or equal to a length of the second overhead projection area.

In some of the embodiments, in the first direction, the length of the first overhead projection area is equal to the length of the second overhead projection area.

In some of the embodiments, the logic control circuit further includes a sense amplifier circuit. The sense amplifier circuit is electrically connected to an output terminal of the first global bit line sub-decoder and an output terminal of the second global bit line sub-decoder. A sense amplifier circuit block formed by the sense amplifier circuit is located in the first overhead projection area and/or the second overhead projection area.

In some of the embodiments, the sense amplifier circuit includes a first sense amplifier sub-circuit and a second sense amplifier sub-circuit. The first sense amplifier sub-circuit is electrically connected to the output terminal of the first global bit line sub-decoder, and a first sub-circuit block of the sensing amplifier formed by the first sense amplifier sub-circuit is located in the first overhead projection area. The second sense amplifier sub-circuit is electrically connected to the output terminal of the second global bit line sub-decoder, and a second sense amplifier sub-circuit block formed by the second sense amplifier sub-circuit is located in the second overhead projection area.

In some of the embodiments, the logic control circuit further includes a first local bit line sub-decoder. The first local bit line sub-decoder includes a first local bit line decoding unit and a second local bit line decoding unit electrically connected to the first global bit line sub-decoder. A first local bit line decoding unit block formed by the first local bit line decoding unit and a second local bit line decoding unit block formed by the second local bit line decoding unit are both located in the first overhead projection area. In the second direction, the first global bit line sub-decoder block is located between the first local bit line decoding unit block and the second local bit line decoding unit block.

In some of the embodiments, the local bit line decoder further includes a second local bit line sub-decoder. The second local bit line sub-decoder includes a third local bit line decoding unit and a fourth local bit line decoding unit electrically connected to the second global bit line sub-decoder. A third local bit line decoding unit block formed by the third local bit line decoding unit and a fourth local bit line decoding unit block formed by the fourth local bit line decoding unit are both located in the second overhead projection area, in the second direction, the second global bit line sub-decoder block is located between the fourth local bit line decoding unit block and the third local bit line decoding unit block.

In some of the embodiments, in the second direction, the fourth local bit line decoding unit block, the third local bit line decoding unit block, the second local bit line decoding unit block, and the first local bit line decoding unit block are arranged in sequence. In the second direction, a distance between the first global bit line sub-decoder block and the second local bit line decoding unit block is smaller than a distance between the first global bit line sub-decoder block and the first local bit line decoding unit block. In the second direction, a distance between the second global bit line sub-decoder block and the third local bit line decoding unit block is smaller than a distance between the second global bit line sub-decoder block and the fourth local bit line decoding unit block.

In some of the embodiments, the logic control circuit further includes a first word line decoding unit and a second word line decoding unit. The first word line decoding unit is electrically connected to the first storage block, and a first word line decoding unit block formed by the first word line decoding unit is located in the first overhead projection area. The second word line decoding unit is electrically connected to the first storage block, and a second word line decoding unit block formed by the second word line decoding unit is located in the first overhead projection area. In the first direction, a projection of the first word line decoding unit block and a projection of the second word line decoding unit block at least partially overlap, and the first word line decoding unit block and the second word line decoding unit block are both located between the first global bit line sub-decoder block and the first local bit line decoding unit block.

In some of the embodiments, in the first direction, the first sub-circuit block of the sensing amplifier is located between the first word line decoding unit block and the second word line decoding unit block; and in the second direction, the first sub-circuit block of the sensing amplifier is located between the first global bit line sub-decoder block and the first local bit line decoding unit block.

In some of the embodiments, in the first direction, a projection of the first sub-circuit block of the sensing amplifier at least partially overlaps with a projection of the first word line decoding unit block and/or a projection of the second word line decoding unit block.

In some of the embodiments, in the second direction, the projection of the first sub-circuit block of the sensing amplifier, the projection of the first word line decoding unit block, and/or the projection of the second word line decoding unit block do not overlap each other.

In some of the embodiments, the logic control circuit further includes a third word line decoding unit and a fourth word line decoding unit. The third word line decoding unit is electrically connected to the second storage block, and a third word line decoding unit block formed by the third word line decoding unit is located in the second overhead projection area. The fourth word line decoding unit is electrically connected to the second storage block, and a fourth word line decoding unit block formed by the fourth word line decoding unit is located in the second overhead projection area. In the first direction, a projection of the third word line decoding unit block and a projection of the fourth word line decoding unit block at least partially overlap; and the third word line decoding unit block and the fourth word line decoding unit block are both located between the second global bit line sub-decoder block and the fourth local bit line decoding unit block.

In some of the embodiments, the first chip includes N storage blocks sequentially arranged along the second direction, the first storage array includes M storage blocks, and the second storage array comprises N-M storage blocks, where M is less than N, and both M and N are positive integers. The first overhead projection area is a projection area of an M-th storage block on the second chip, and the second overhead projection area is a projection area of an (M+1)-th storage block on the second chip. The first global bit line sub-decoder is electrically connected to at least one of the first local bit line decoding unit to 2M-th local bit line decoding unit, and the second global bit line sub-decoder is electrically connected to at least one of (2M+1)-th local bit line decoding unit to 2N-th local bit line decoding unit.

In some of the embodiments, M is equal to N/2 after rounding, and the second global bit line sub-decoder block, a (2M+1)-th local bit line decoding unit block formed by the (2M+1)-th local bit line decoding unit, a 2M local bit line decoding unit block formed by the 2M local bit line decoding unit, and the first global bit line sub-decoder block are sequentially arranged adjacent to each other along the second direction.

In some of the embodiments, the memory device further includes a plurality of first wirings and a plurality of second wirings. The plurality of first wirings are electrically connected to the first global bit line sub-decoder and the first local bit line decoding unit to the 2M-th local bit line decoding unit. The plurality of second wirings are electrically connected to the second global bit line sub-decoder and the (2M+1)-th local bit line decoding unit to the 2N-th local bit line decoding unit.

In some of the embodiments, in the second direction, a projection of the second sense amplifier sub-circuit block, a projection of the third word line decoding unit block, and/or a projection of the fourth word line decoding unit block do not overlap each other.

In a second aspect, the present application provides a preparation method of a memory device, including: constructing a first storage array and a second storage array on a first chip, the first storage array includes at least one first storage block, the first storage block includes a plurality of first word lines extending along a first direction and a plurality of first bit lines extending along a second direction, the second storage array includes at least one second storage block, and the second storage block includes a plurality of second word lines extending along the first direction and a plurality of second bit lines extending along the second direction; constructing a logic control circuit on a second chip, the logic control circuit includes a first global bit line sub-decoder and a second global bit line sub-decoder, the first global bit line sub-decoder is electrically connected to the at least one first storage block, the second global bit line sub-decoder is electrically connected to the at least one second storage block, and the second chip has a first overhead projection area of the first storage block and a second overhead projection area of the second storage block, a first global bit line sub-decoder block formed by the first global bit line sub-decoder is located in the first overhead projection area, a second global bit line sub-decoder block formed by the second global bit line sub-decoder is located in the second overhead projection area, and in the second direction, the second overhead projection area and the first overhead projection area are arranged in sequence; and stacking the second chip above the first chip along a third direction.

In some of the embodiments, the preparation method further includes: constructing a sense amplifier circuit in the logic control circuit; electrically connecting the sense amplifier circuit to an output terminal of the first global bit line sub-decoder and an output terminal of the second global bit line sub-decoder; and configuring a sense amplifier circuit block formed by the sense amplifier circuit to be located within the first overhead projection area and/or the second overhead projection area.

In some of the embodiments, the preparation method further includes: constructing a first sense amplifier sub-circuit and a second sense amplifier sub-circuit in the sense amplifier circuit; electrically connecting the first sense amplifier sub-circuit to an output terminal of the first global bit line sub-decoder, and electrically connecting the second sense amplifier sub-circuit to an output terminal of the second global bit line sub-decoder; and configuring a first sub-circuit block of the sensing amplifier formed by the first sense amplifier sub-circuit to be located in the first overhead projection area, and configuring a second sense amplifier sub-circuit block formed by the second sense amplifier sub-circuit to be located in the second overhead projection area.

By constructing the first global bit line sub-decoder block in the first overhead projection area formed by the first storage block and the second global bit line sub-decoder block in the second overhead projection area formed by the second storage block, the memory device provided by the present application and its preparation method can reduce the occupied area after the first chip and the second chip are stacked, thereby reducing the occupied area of the memory device and helping to minimize the memory device size.

Based on a setting of the decoder completely within the projection area and a stacked structure of the two chips, the decoder can be connected to the storage array longitudinally without additional transverse wiring connection, so there is no need to leave wiring space between the two sub-modules, which further reduces the area of the first chip and the second chip.

BRIEF DESCRIPTION OF DRAWINGS

The following detailed description of specific embodiments of the present application in conjunction with the accompanying drawings will make the technical solutions and other beneficial effects of the present application obvious.

Figure 5:
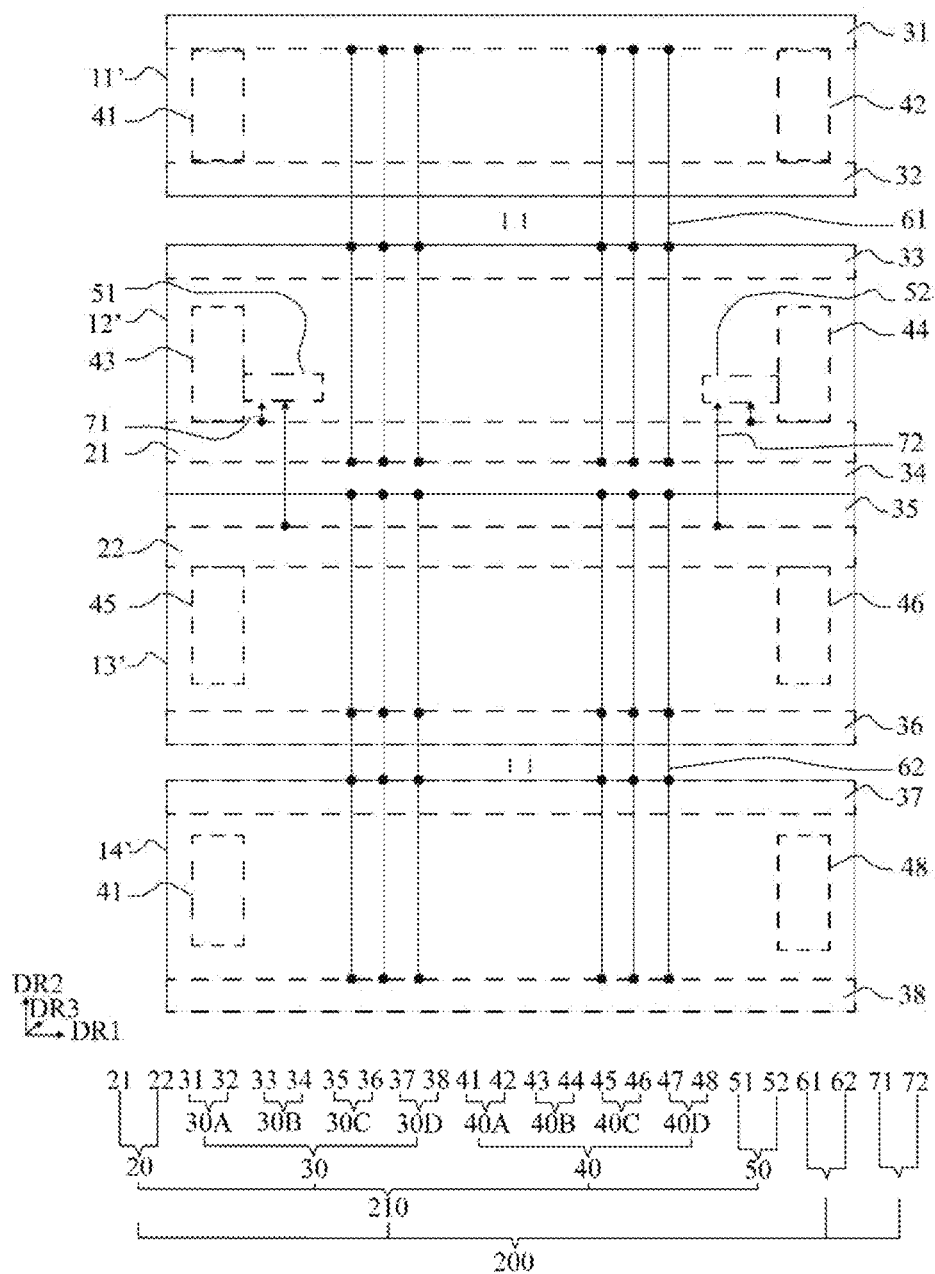
FIG. 5 is a schematic diagram of a structural distribution of a second chip of a memory device provided by an embodiment of the present application.

FIG. Z is a schematic diagram of a structural distribution of a first sense amplifier sub-circuit in FIG. 5.

Figure 6:
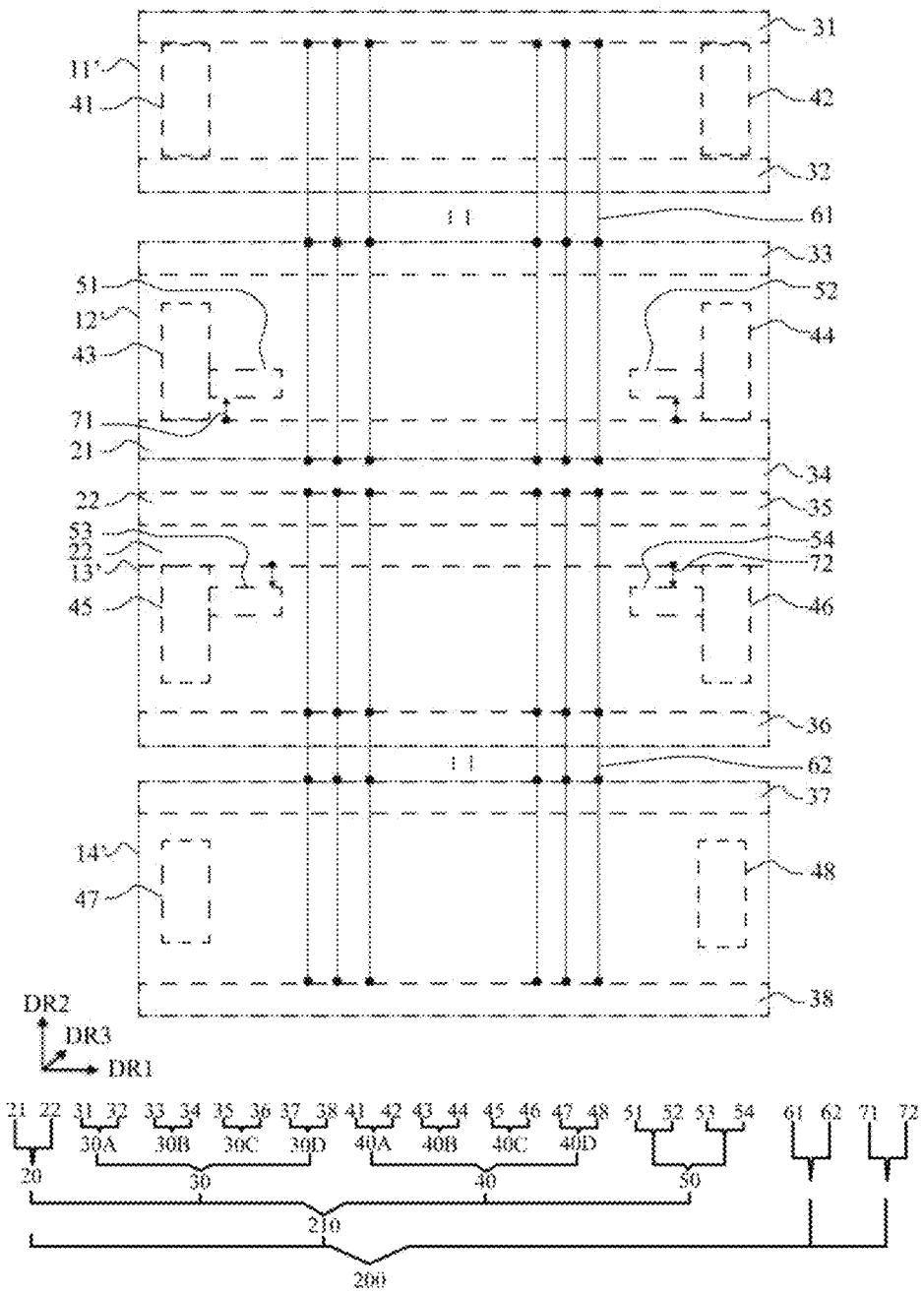
FIG. 6 is a schematic diagram of another structural distribution of a second chip of a memory device provided by an embodiment of the present application.
Figure 8:
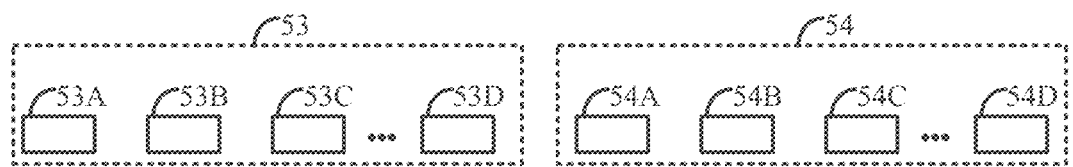

FIG. 8 is a schematic diagram of a structural distribution of a second sense amplifier sub-circuit in FIG. 6.

Figure 9:
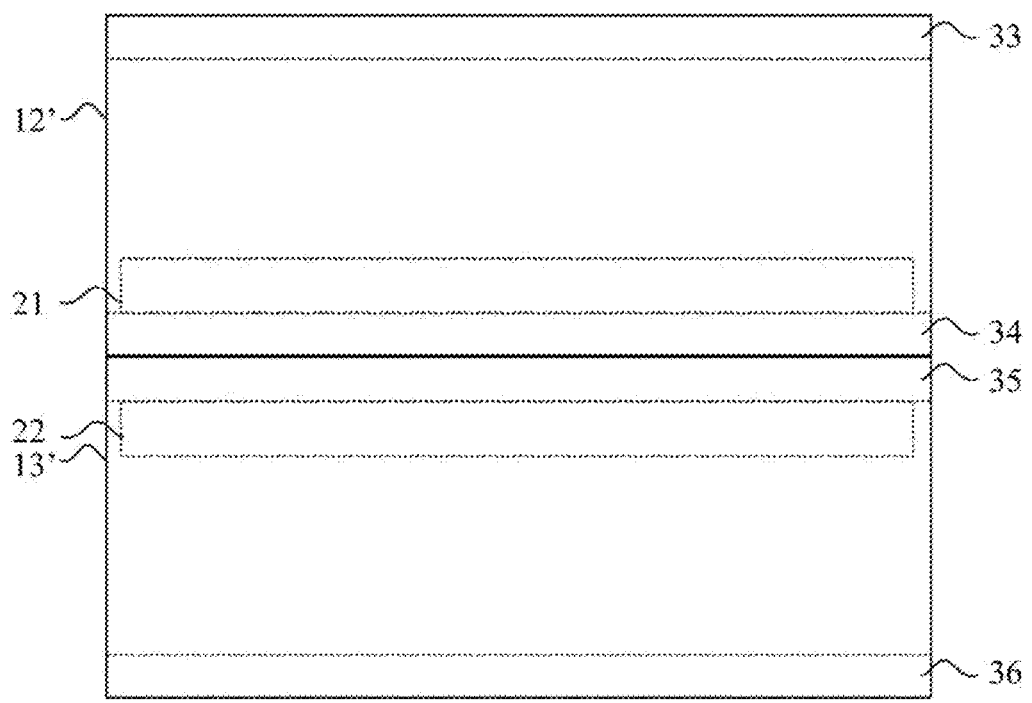

FIG. 9 is a schematic diagram of another structural distribution of a part of a second chip in the memory device provided by an embodiment of the present application.

FIG. 10 is a schematic flowchart of a preparation method of the memory device provided by the embodiment of the present application.

DETAILED DESCRIPTION OF EMBODIMENTS

The technical solution in the embodiments of the present application will be clearly and completely described below in conjunction with the drawings in the embodiments of the present application. Obviously, the described embodiments are only a part of the present application, rather than all the embodiments. Based on the embodiments in the present application, all other embodiments obtained by those skilled in the art without creative work fall within the scope of protection of the present application.

In the description of the present disclosure, a word line decoder is also described as an X-DEC, and a bit line decoder can be described as a bit line selector, a bit line multiplexer or a Y-MUX, which is used to locate most storage cells in a storage array for further reading and writing operations on the storage cells.

In the description of the present disclosure, it should be understood that the terms "center", "longitudinal", "transverse", "length", "width", "thickness", "upper", "lower", "front", ""back", "left", "right", "vertical", "horizontal", "top", "bottom", "inner", "outer", "clockwise", "counter-clockwise", and other directions or positional relationship are all based on an orientation or positional relationship shown in the drawings, which is only for convenience of simplifying the description of the present disclosure, and does not indicate or imply that the device or component referred to must have a specific orientation or be constructed and operated in a specific orientation. Therefore, they cannot be understood as limitations of the present disclosure. In addition, terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more than two, unless specifically defined otherwise.

In the description of the present disclosure, it should be noted that, unless otherwise clearly specified and limited, terms "installed", "connected", and "attached" should be interpreted broadly. For example, they may be fixed connection, detachable connection, integrally connected, mechanically connected, electrically connected or mutually communication, directly connected, indirectly connected through an intermediate medium, an internal communication of two components, or an interaction relation of two components. For those of ordinary skill in the art, the specific meaning of the above-mentioned terms in the present disclosure can be understood according to specific circumstances.

In the present application, unless expressly stipulated and defined otherwise, a first feature "on" or "under" a second feature may indicate that the first feature and the second feature are in direct contact, or may indicate the first feature and the second feature are not in direct contact but through a third feature besides them. Moreover, the first feature "on", "upon" and "above" the second feature indicates that the first feature is directly above or obliquely above the second feature, or simply means that the first feature is higher in level than the second feature. The first feature "below", "under" and "beneath" the second feature indicates that the first feature is directly below or obliquely below the second feature, or simply means that the first feature is lower in level than the second feature.

Figure 1:
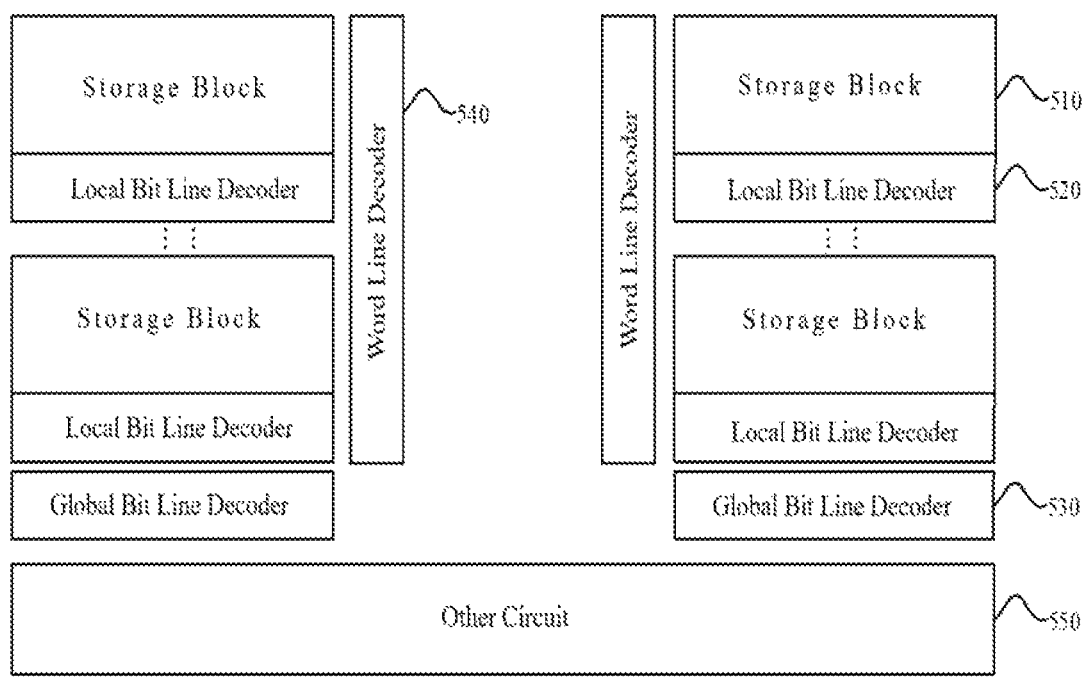
FIG. 1 is a distribution schematic diagram of structure of each part of a memory device provided by a traditional technical solution.
Figure 2:
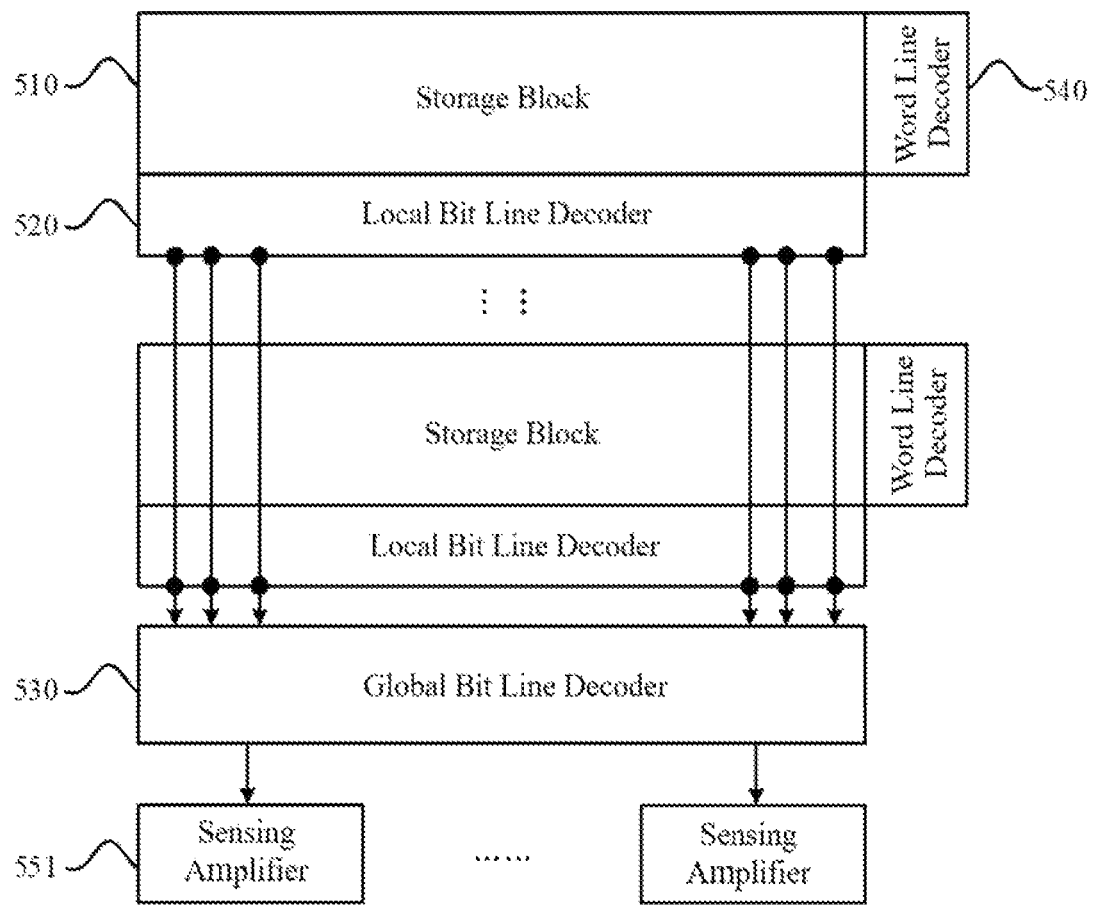
FIG. 2 is another distribution schematic diagram of structure of each part of a memory device provided by a traditional technical solution.
Figure 3:
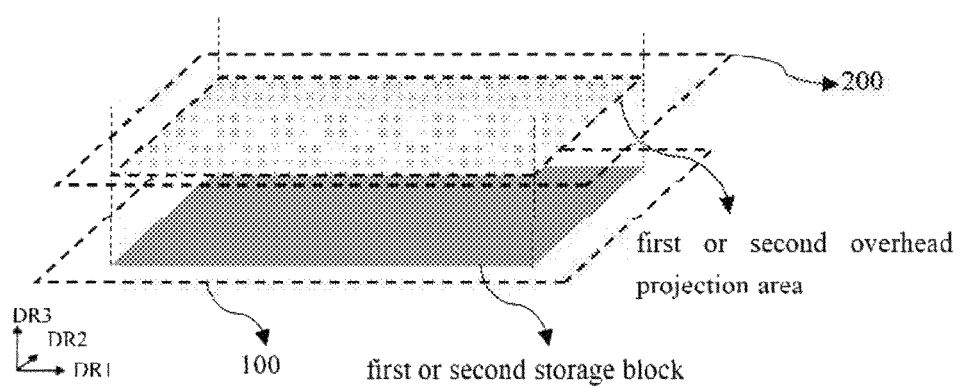
FIG. 3 is a perspective architecture view of a memory device provided by an embodiment of the present invention.
Figure 4:
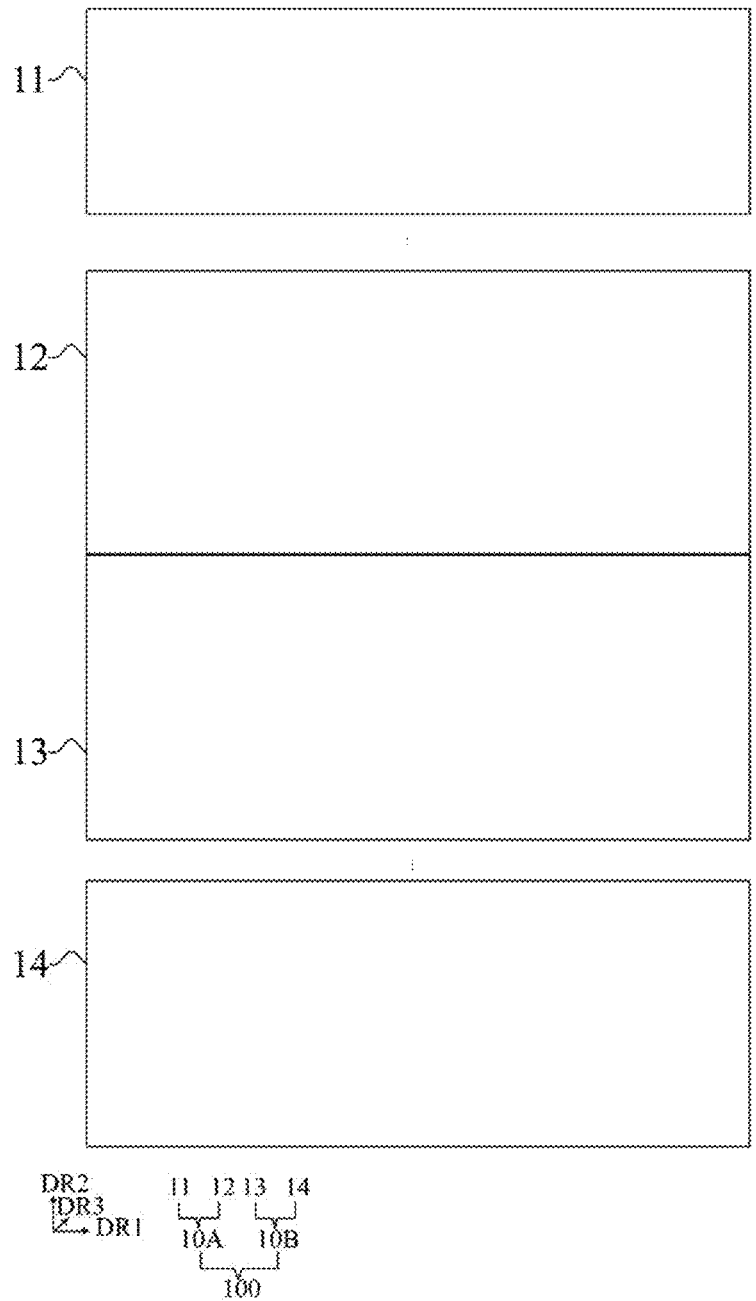
FIG. 4 is a schematic diagram of a structural distribution of a first chip of a memory device provided by an embodiment of the present application.

Please refer to FIG. 3 to FIG. 10. As shown in FIGS. 3 to 6, the embodiment provides a memory device. The memory device includes a first chip 100 and a second chip 200. As shown in FIG. 4, the first chip 100 includes a first storage array 10A and a second storage array 10B. The first storage array 10A includes at least one first storage block, and the first storage block includes a plurality of first word lines extending along a first direction DR1 and a plurality of first bit lines extending along a second direction DR2. The second storage array 10B includes at least one second storage block, and the second storage block includes a plurality of second word lines extending along the first direction DR1 and a plurality of second bit lines extending along the second direction DR2. As shown in FIGS. 5 and 6, the second chip 200 includes a logic control circuit 210. The logic control circuit 210 includes a first global bit line sub-decoder 21 and a second global bit line sub-decoder 22. The first global bit line sub-decoder is electrically connected to the at least one first storage block, and the second global bit line sub-decoder 22 is electrically connected to the at least one second storage block. The second chip 200 has a first overhead projection area 12' of the first storage block and a second overhead projection area 13' of the second storage block. A first global bit line sub-decoder block formed by the first global bit line sub-decoder 21 is located in the first overhead projection area 12', and a second global bit line sub-decoder block formed by the second global bit line sub-decoder 22 is located in the second overhead projection area 13'. In the second direction DR2, the second overhead projection area 13' and the first overhead projection area 12' are sequentially arranged.

It can be understood that, by constructing the first global bit line sub-decoder block in the first overhead projection area 12' formed by the first storage block and the second global bit line sub-decoder block in the second overhead projection area 13' formed by the second storage block, an occupied area after the first chip 100 and the second chip 200 are stacked is reduced, thereby reducing the occupied area of the memory device and helping to minimize the size of the memory device.

The logic control circuit 210 includes a global bit line decoder 20. The global bit line decoder 20 includes the first global bit line sub-decoder 21 and the second global bit line sub-decoder 22.

It should be noted that at least part of the overlap in the present application can be partial overlap or can also be full overlap. The first storage block may be any storage block in the first storage array 10A, for example, any one of the first storage block 11 to an M-th storage block 12. Specifically, the first storage block may be the M-th storage block 12. The second storage block may be any storage block in the second storage array 10B, for example, any one of an (M+1)-th storage block 13 to an N-th storage block 14. Specifically, the second storage block may be the (M+1)-th storage block 13. M and N are both positive integers, and N is greater than M.

The first direction DR1 may be an extension direction of the word line. The second direction DR2 may be an extension direction of the bit line. The third direction DR3 may be a thickness direction of the memory device.

In one of the embodiments, in the second direction DR2, the first overhead projection area 12' and the second overhead projection area 13' are adjacent. "Adjacent" means that edges of the two projection areas meet or are close to each other. It can be understood that, in this way, a spatial distribution among the first global bit line sub-decoder 21, the second global bit line sub-decoder 22, and a sense amplifier circuit 50 can be more compact, which is convenient for the first global bit line sub-decoder 21 and the second global bit line sub-decoder 22 to share a same sense amplifier circuit 50, which can also reduce an electrical transmission distance of the sense amplifier circuit 50 to the first global bit line sub-decoder 21 and the second global bit line sub-decoder 22.

In one of the embodiments, as shown in FIGS. 5, 6 and 9, in the first direction DR1, a length of the first global bit line sub-decoder block is less than or equal to a length of the first overhead projection area 12'. In the first direction DR1, a length of the second global bit line sub-decoder block is less than or equal to a length of the second overhead projection area 13'.

In one of the embodiments, in the first direction DR1, the length of the first overhead projection area 12' is equal to the length of the second overhead projection area 13.

In one of the embodiments, the logic control circuit 210 further includes the sense amplifier circuit 50. The sense amplifier circuit 50 is electrically connected to an output terminal of the first global bit line sub-decoder 21 and an output terminal of the second global bit line sub-decoder 22. An sense amplifier circuit block formed by the sense amplifier circuit 50 is located in the first overhead projection area 12' and/or the second overhead projection area 13'. It can be understood that, by constructing the sense amplifier circuit block in the first overhead projection area 12' and/or the second overhead projection area 13', the occupied area after the first chip 100 and the second chip 200 are stacked can be reduced, thereby reducing the occupied area of the memory device, helping to minimize the size of the memory device and reducing a distance between the sense amplifier circuit 50 and the two global bit line sub-decoders, which reduces a delay.

It should be noted that in this embodiment, the first storage array 10A and the second storage array 10B can share a same sense amplifier circuit 50.

As shown in FIG. 6, in one of the embodiments, the sense amplifier circuit 50 includes a first sense amplifier sub-circuit 51, a second sense amplifier sub-circuit 52, a third sense amplifier sub-circuit 53, and a fourth sense amplifier sub-circuit 54. The output terminal of the first global bit line sub-decoder 21 is electrically connected to the first sense amplifier sub-circuit 51 and the second sense amplifier sub-circuit 52. A first sense amplifier sub-circuit block formed by the first sense amplifier sub-circuit 51 and a second sense amplifier sub-circuit block formed by the second sense amplifier sub-circuit 52 are both located in the first overhead projection area 12'. The output terminal of the second global bit line sub-decoder 22 is electrically connected to the third sense amplifier sub-circuit 53 and the fourth sense amplifier sub-circuit 54. A third sense amplifier sub-circuit block formed by the third sense amplifier sub-circuit 53 and a fourth sense amplifier sub-circuit block formed by the fourth sense amplifier sub-circuit 54 are both located in the second overhead projection area 13'.

It can be understood that, in this embodiment, the first storage array 10A is electrically connected to the first sense amplifier sub-circuit 51 and the second sense amplifier sub-circuit 52 through the first global bit line sub-decoder 21, and the second storage array 10B is electrically connected to the third sense amplifier sub-circuit 53 and the fourth sense amplifier sub-circuit 54 through the second global bit line sub-decoder 22. Each storage array can use a set of sense amplifier sub-circuits separately, so that a bit line read operation of each storage array can be implemented independently and respectively.

In one of the embodiments, the logic control circuit 210 further includes a local bit line decoder 30. The local bit line decoder 30 includes a first local bit line sub-decoder 30A. The first local bit line sub-decoder 30A is electrically connected to the first global bit line sub-decoder 21. The first local bit line sub-decoder 30A includes a first local bit line decoding unit 31 and a second local bit line decoding unit 32. A first local bit line decoding unit block formed by the first local bit line decoding unit 31 and a second local bit line decoding unit block formed by the second local bit line decoding unit 32 are both located in the first overhead projection area 11'. In the second direction DR2, the first global bit line sub-decoder block is located between the first local bit line decoding unit block and the second local bit line decoding unit block.

It can be understood that, by constructing the first local bit line decoding unit block and the second local bit line decoding unit block in the first overhead projection area, an occupied area after the first chip 100 and the second chip 200 are stacked is reduced, thereby reducing the occupied area of the memory device and helping to minimize the size of the memory device.

In some embodiments, the first global bit line sub-decoder block, the first local bit line decoding unit block, and/or the second local bit line decoding unit block may be located in different layers of a same chip. The first global bit line sub-decoder block may also at least partially overlap with the first local bit line decoding unit block and/or the second local bit line decoding unit block in the third direction DR3.

In some embodiments, the first global bit line sub-decoder block is located between the first local bit line decoding unit block and the second local bit line decoding unit block, and the first global bit line sub-decoder block does not overlap with the first local bit line decoding unit block and/or the second local bit line decoding unit block.

It should be noted that, in this embodiment, each first storage block is electrically connected to a corresponding local bit line sub-decoder. For example, the first storage block 11 may be electrically connected to the first local bit line decoding unit 31 and the second local bit line decoding unit 32. The local bit line decoder 30 further includes an M-th local bit line sub-decoder 30B. The M-th local bit line sub-decoder 30B includes a (2M−1)-th local bit line decoding unit 33 and a 2M-th local bit line decoding unit 34. The M-th storage block 12 can be electrically connected to the (2M−1)-th local bit line decoding unit 33 and the 2M-th local bit line decoding unit 34. The first storage block may be any storage block of the first storage block 11 to the M-th storage block 12. When the first storage block is the M-th storage block 12, the first local bit line decoding unit may be the (2M−1)-th local bit line decoding unit 33 and the second local bit line decoding unit may be the 2M-th local bit line decoding unit 34. In a same way, the second storage block may be any storage block of the (M+1)-th storage block to the N-th storage block 14.

In one of the embodiments, the local bit line decoder 30 further includes a second local bit line sub-decoder 30C. The second local bit line sub-decoder 30C is electrically connected to the second global bit line sub-decoder 22. The second local bit line sub-decoder 30C includes a third local bit line decoding unit 35 and a fourth local bit line decoding unit 36. A third local bit line decoding unit block formed by the third local bit line decoding unit 35 and a fourth local bit line decoding unit block formed by the fourth local bit line decoding unit 36 are both located in the second overhead projection area 13'. In the second direction DR2, the second global bit line sub-decoder block is located between the fourth local bit line decoding unit block and the third local bit line decoding unit block.

It should be noted that, in this embodiment, each second storage block is electrically connected to a corresponding local bit line sub-decoder. For example, the second storage block may be electrically connected to the third local bit line decoding unit 35 and the fourth local bit line decoding unit 36. The second local bit line sub-decoder 30C may be an (M+1)-th local bit line sub-decoder 30C. The (M+1)-th local bit line sub-decoder 30C includes a (2M+1)-th local bit line decoding unit 35 and a (2M+2)-th local bit line decoding unit 36. The (M+1)-th storage block 13 may be electrically connected to the (2M+1)-th local bit line decoding unit 35 and the (2M+2)-th local bit line decoding unit 36. The local bit line decoder 30 also includes a fourth local bit line sub-decoder. The fourth local bit line sub-decoder may be an N-th local bit line sub-decoder 30D. The N-th local bit line sub-decoder 30D includes a (2N−1)-th local bit line decoding unit 37 and a 2N-th local bit line decoding unit 38. The N-th storage block 14 can be electrically connected to the (2N−1)-th local bit line decoding unit 37 and the 2N-th local bit line decoding unit 38. A (2N−1)-th local bit line decoding unit block formed by the (2N−1)-th local bit line decoding unit 37 and a 2N-th local bit line decoding unit block formed by the 2N-th local bit line decoding unit 38 are both located in the second overhead projection area 14' of the N-th storage block 14 projected on the second chip 200.

In one of the embodiments, in the second direction DR2, the fourth local bit line decoding unit block, the third local bit line decoding unit block, the second local bit line decoding unit block, and the first local bit line decoding unit block are arranged in sequence. In the second direction DR2, a distance between the first global bit line sub-decoder block and the second local bit line decoding unit block is smaller than a distance between the first global bit line sub-decoder block and the first local bit line decoding unit block. In the second direction DR2, a distance between the second global bit line sub-decoder block and the third local bit line decoding unit block is smaller than a distance between the second global bit line sub-decoder block and the fourth local bit line decoding unit block.

In one of the embodiments, the logic control circuit 210 further includes a first word line decoding unit 41 and a second word line decoding unit 42. The first word line decoding unit 41 is electrically connected to the first storage block 11, and a first word line decoding unit block formed by the first word line decoding unit 41 is located in the first overhead projection area 11'. The second word line decoding unit 42 is electrically connected to the first storage block 11, and a second word line decoding unit block formed by the second word line decoding unit 42 is located in the first overhead projection area 11'. In the first direction DR1, a projection of the first word line decoding unit block and a projection of the second word line decoding unit block at least partially overlap, and the first word line decoding unit block and the second word line decoding unit block are both located between the first global bit line sub-decoder block and the first local bit line decoding unit block (as shown in FIG. 6, when M is 1 and N is 2).

It can be understood that, by constructing the first word line decoding unit block formed by the first word line decoding unit 41 and the second word line decoding unit block formed by the second word line decoding unit 42 in the first overhead projection area 112, an occupied area by the first chip 100 and the second chip 200 after being stacked is reduced, thereby reducing the occupied area of the memory device and helping to minimize the size of the memory device.

In some embodiments, the first word line decoding unit block and the second word line decoding unit block are both located between the first global bit line sub-decoder block and the second local bit line decoding unit block. The first word line decoding unit block does not overlap with the first global bit line sub-decoder block and/or the second local bit line decoding unit block. The second word line decoding unit block does not overlap with the first global bit line sub-decoder block and/or the second local bit line decoding unit block. The first word line decoding unit block and the second word line decoding unit block do not overlap, either.

It should be noted that in this embodiment, the logic control circuit 210 includes a word line decoder 40. The word line decoder 40 includes at least one word line sub-decoder. The word line sub-decoder may include two word line decoding units. In some embodiments, any storage block is configured with one or two corresponding word line decoding units. For example, the first word line sub-decoder 40A includes the first word line decoding unit 41 and the second word line decoding unit 42, the first storage block 11 is electrically connected to the first word line decoding unit 41 and the second word line decoding unit 42. An M-th word line sub-decoder 40B includes a (2M−1)-th word line decoding unit 43 and a 2M-th word line decoding unit 44, and the M-th storage block 12 is electrically connected to the (2M−1)-th word line decoding unit 43 and the 2M-th word line decoding unit 44. The (M+1)-th word line sub-decoder 40C includes a (2M+1)-th word line decoding unit 45 and a (2M+2)-th word line decoding unit 46, and the (M+1)-th storage block 13 is electrically connected to the (2M+1)-th word line decoding unit 45 and the (2M+2)-th word line decoding unit 46. The N-th word line sub-decoder 40D includes a (2N−1)-th word line decoding unit 47 and a 2N-th word line decoding unit 48, and the N-th storage block 14 is electrically connected to the (2N−1)-th word line decoding unit 47 and the 2N-th word line decoding unit 48.

In one of the embodiments, in the first direction DR1, the first sense amplifier sub-circuit block is located between the first word line decoding unit block and the second word line decoding unit block; and in the second direction DR2, the first sense amplifier sub-circuit block is located between the first global bit line sub-decoder block and the first local bit line decoding unit block.

It can be understood that, in this embodiment, the first sense amplifier sub-circuit block does not overlap with the first word line decoding unit block and/or the second word line decoding unit block. Similarly, the first sense amplifier sub-circuit block does not overlap with the first global bit line sub-decoder block and/or the first local bit line decoding unit block.

In one of the embodiments, in the first direction DR1, a projection of the first sense amplifier sub-circuit block at least partially overlaps with the projection of the first word line decoding unit block and/or the projection of the second word line decoding unit block.

In one of the embodiments, in the second direction DR2, the projection of the first sense amplifier sub-circuit block does not overlap with the projection of the first word line decoding unit block and/or the projection of the second word line decoding unit block.

In one of the embodiments, the second chip 200 further includes a plurality of first wirings 61. The plurality of first wirings 61 are electrically connected to the first global bit line sub-decoder 21 and the first local bit line decoding unit 31 to the 2M-th local bit line decoding unit 34.

In one of the embodiments, the second chip 200 further includes a plurality of second wirings 62. The plurality of second wirings 62 are electrically connected to the second global bit line sub-decoder 22 and the (2M+1)-th local bit line decoding unit 35 to the 2N-th local bit line decoding unit 38.

Both the first wirings 61 and the second wirings 62 may be global bit lines. This setting is equivalent to dividing the storage blocks into two groups (the first storage array 10A and the second storage array 10B), where the first storage block 11 to the M-th storage block 12 are the first group of storage blocks (the first storage array 10A), and the (M+1)-th storage block 13 to the N-th storage block 14 are the second group of storage blocks (the second storage array 10B). The first wirings 61 electrically connect the first group of storage blocks to the first global bit line sub-decoder 21, and the second wirings 62 electrically connect the second group of storage blocks to the second global bit line sub-decoder 22. In this way, with the grouping of the storage blocks and a three-dimensional bonding process (i.e., the second chip 200 is stacked above/bonded to the first chip 100 in the third direction), the connection between each storage block and the global decoder/global bit line decoder 20 can be comprehensively shortened, and the connection between the global decoder/global bit line decoder 20 and the local decoder/local bit line decoder 30 is also reduced, so that the chip delay is greatly reduced.

In one of the embodiments, the second chip 200 further includes a plurality of third wirings 71, and the plurality of third wires 71 are electrically connected to the first global bit line sub-decoder 21 and the sense amplifier circuit 50.

In one of the embodiments, the second chip 200 further includes a plurality of fourth wirings 72, and the plurality of fourth wirings 72 are electrically connected to the second global bit line sub-decoder 22 and the sense amplifier circuit 50.

Figure 7:
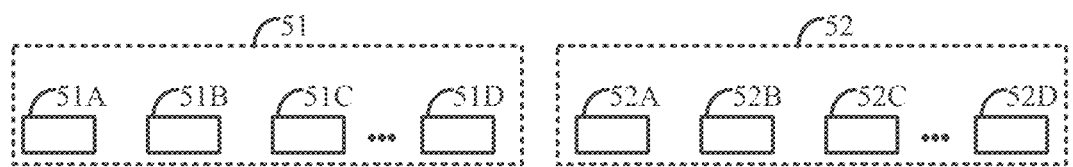

As shown in FIG. 7, the first sense amplifier sub-circuit 51 may include a plurality of sensing amplifiers arranged along the first direction DR1, for example, a sensing amplifier 51A, a sensing amplifier S1B, a sensing amplifier 51C, a sensing amplifier 51D, and so on. The second sense amplifier sub-circuit 52 may also include a plurality of sensing amplifiers arranged along the first direction DR1, for example, a sensing amplifier 52A, a sensing amplifier 52B, a sensing amplifier 52C, a sensing amplifier 52D, and so on. The first direction DR1 may be a bit line arrangement direction of the first storage array 10A or the second storage array 10B.

As shown in FIG. 8, the third sensing amplifier sub-circuit 53 may include a plurality of sensing amplifiers arranged along the first direction DR1, for example, a sensing amplifier 53A, a sensing amplifier 53B, a sensing amplifier 53C, a sensing amplifier 53D, and so on. The fourth sense amplifier sub-circuit 54 may also include a plurality of sensing amplifiers arranged along the first direction DR1, for example, a sensing amplifier 54A, a sensing amplifier 54B, a sensing amplifier 54C, a sensing amplifier 54D, and so on.

In one of the embodiments, the N-th storage block 14 to the first storage block 11 are sequentially arranged along the second direction DR2, and the second direction DR2 may be a word line arrangement direction of the first storage array 10A or the second storage array 10B.

In one of the embodiments, the first chip 100 and the second chip 200 are overlapped or stacked along the third direction DR3. It can be understood that the third direction DR3 may be a thickness direction of the first chip 100 and the second chip 200 after being stacked.

In one of the embodiments, the logic control circuit 210 further includes a third word line decoding unit and a fourth word line decoding unit. The third word line decoding unit is electrically connected to the second storage block, and a third word line decoding unit block formed by the third word line decoding unit is located in the second overhead projection area. The fourth word line decoding unit is electrically connected to the second storage block, and a fourth word line decoding unit block formed by the fourth word line decoding unit is located in the second overhead projection area. In the first direction DR1, a projection of the third word line decoding unit block and a projection of the fourth word line decoding unit block at least partially overlap. The third word line decoding unit block and the fourth word line decoding unit block are both located between the second global bit line sub-decoder block and the fourth local bit line decoding unit block.

In one of the embodiments, in the first direction DR1, the second sense amplifier sub-circuit block is located between the third word line decoding unit block and the fourth word line decoding unit block; and in the second direction DR2, the second sense amplifier sub-circuit block is located between the second global bit line sub-decoder block and the fourth local bit line decoding unit block.

In one of the embodiments, in the first direction DR1, a projection of the second sense amplifier sub-circuit block at least partially overlaps with a projection of the third word line decoding unit block and/or a projection of the fourth word line decoding unit block.

In one of the embodiments, in the second direction DR2, a projection of the second sense amplifier sub-circuit block does not overlap with a projection of the third word line decoding unit block and/or a projection of the fourth word line decoding unit block.

It should be noted that the projection of the second sense amplifier sub-circuit block does not overlap with the projection of the third word line decoding unit block and/or the projection of the fourth word line decoding unit block. It means: in the second direction, the second sense amplifier sub-circuit block may have the projection of the second sense amplifier sub-circuit block, the third word line decoding unit block may have the projection of the third word line decoding unit block, and the fourth word line decoding unit block may have the projection of the fourth word line decoding unit block; and in the second direction, the projection of the second sense amplifier sub-circuit block does not overlap with the projection of the third word line decoding unit block and/or the projection of the fourth word line decoding unit block on any plane perpendicular to the second direction.

In one of the embodiments, the first chip 100 includes N storage blocks arranged in sequence along the second direction DR2. The first storage array 10A includes M storage blocks, and the second storage array 10B includes N-M storage blocks, where M is less than N, and M and N are both positive integers. The first overhead projection area 12' is a projection area of the M-th storage block 12 on the second chip 200, and the second overhead projection area 13' is a projection area of the (M+1)-th storage block 13 on the second chip 200. The first global bit line decoder 21 is electrically connected to at least one of the first local bit line decoding unit 31 to the 2M-th local bit line decoding unit 34, and the second global bit line sub-decoder 22 is electrically connected to at least one of the (2M+1)-th local bit line decoding unit 35 to the 2N-th local bit line decoding unit 38.

In one of the embodiments, M is equal to N/2 after rounding; and the second global bit line sub-decoder block, the (2M+1)-th local bit line decoding unit block formed by the (2M+1)-th local bit line decoding unit 35, the 2M local bit line decoding unit block formed by the 2M local bit line decoding unit 34, and the first global bit line sub-decoder block are sequentially arranged adjacently along the second direction DR2.

In one of the embodiments, the memory device further includes the plurality of first wirings 61 and the plurality of second wirings 62. The plurality of first wirings 61 are electrically connected to the first global bit line sub-decoder 21 and the first local bit line decoding unit 31 to the 2M-th local bit line decoding unit 34. The plurality of second wirings 62 are electrically connected to the second global bit line sub-decoder 22 and the (2M+1)-th local bit line decoding unit 35 to the 2N-th local bit line decoding unit 38.

In one of the embodiments, in the second direction DR2, the projection of the second sense amplifier sub-circuit block does not overlap with the projection of the third word line decoding unit block and/or the projection of the fourth word line decoding unit block.

As shown in FIG. 10, in one of the embodiments, the embodiment provides a preparation method for a memory device, which includes following steps:

Step S10: Constructing a first storage array and a second storage array on a first chip, the first storage array includes at least one first storage block, the first storage block includes a plurality of first word lines extending along a first direction and a plurality of first bit lines extending along a second direction, the second storage array includes at least one second storage block, and the second storage block includes a plurality of second word lines extending along the first direction and a plurality of second bit lines extending along the second direction.

Step S20: Constructing a logic control circuit on a second chip, the logic control circuit includes a first global bit line sub-decoder and a second global bit line sub-decoder, the first global bit line sub-decoder is electrically connected to the at least one first storage block, the second global bit line sub-decoder is electrically connected to the at least one second storage block, and the second chip has a first overhead projection area of the first storage block and a second overhead projection area of the second storage block; a first global bit line sub-decoder block formed by the first global bit line sub-decoder is located in the first overhead projection area, a second global bit line sub-decoder block formed by the second global bit line sub-decoder is located in the second overhead projection area; and in the second direction, the second overhead projection area and the first overhead projection area are arranged in sequence.

Step S30: Stacking the second chip above the first chip in a third direction.

It can be understood that, by constructing the first global bit line sub-decoder block in the first overhead projection area formed by the first storage block and constructing the second global bit line sub-decoder block in the second overhead projection area formed by the second storage block, an occupied area after the first chip and the second chip are stacked can be reduced, thereby reducing an occupied area of the memory device and helping to minimize a size of the memory device.

In one of the embodiments, the preparation method further includes: constructing an sense amplifier circuit in the logic control circuit; electrically connecting the sense amplifier circuit to an output terminal of the first global bit line sub-decoder and an output terminal of the second global bit line sub-decoder; and configuring an sense amplifier circuit block formed by the sense amplifier circuit to be located within the first overhead projection area and/or the second overhead projection area.

In one of the embodiments, the preparation method further includes: constructing a first sense amplifier sub-circuit and a second sense amplifier sub-circuit in the sense amplifier circuit; electrically connecting the first sense amplifier sub-circuit to an output terminal of the first global bit line sub-decoder, and electrically connecting the second sense amplifier sub-circuit to an output terminal of the second global bit line sub-decoder; and configuring a first sense amplifier sub-circuit block formed by the first sense amplifier sub-circuit to be located in the first overhead projection area, and configuring a second sense amplifier sub-circuit block formed by the second sense amplifier sub-circuit to be located in the second overhead projection area.

In the above-mentioned embodiments, the description of each embodiment has its own emphasis. For parts that are not described in detail in an embodiment, reference may be made to related descriptions of other embodiments.

The above is a detailed introduction to the memory device and the preparation method thereof provided by the embodiments of the present application. Specific examples are used in this article to illustrate the principle and implementation of the embodiments of the present application. The description of the embodiments is only used to help understand the technical solutions and core ideas of the embodiments of the present application. Those of ordinary skill in the art should understand that they can still modify the technical solutions recorded in the aforementioned embodiments or equivalently replace part of the technical features. These modifications or replacements do not cause the essence of the corresponding technical solutions to deviate from the scope of the technical solutions in the various embodiments of the present application.

What is claimed is:

1. A memory device, comprising:
   a first chip comprising a first storage array and a second storage array; the first storage array comprises at least one first storage block, and the first storage block comprises a plurality of first word lines extending along a first direction and a plurality of first bit lines extending along a second direction; the second storage array comprises at least one second storage block, and the second storage block comprises a plurality of second word lines extending along the first direction and a plurality of second bit lines extending along the second direction; and
   a second chip stacked above the first chip in a third direction; the second chip comprises a logic control circuit, and the logic control circuit comprises a first global bit line sub-decoder and a second global bit line sub-decoder; the first global bit line sub-decoder is electrically connected to the at least one first storage block, and the second global bit line sub-decoder is electrically connected to the at least one second storage block; the second chip has a first overhead projection area projected on the second chip by a first storage block of the at least one first storage block and a second overhead projection area projected on the second chip by a second storage block of the at least one second storage block; a first global bit line sub-decoder block formed by the first global bit line sub-decoder is located in the first overhead projection area, and a second global bit line sub-decoder block formed by the second global bit line sub-decoder is located in the second overhead projection area; and in the second direction, the second overhead projection area and the first overhead projection area are sequentially arranged.

2. The memory device according to claim 1, wherein in the second direction, the first overhead projection area and the second overhead projection area are adjacent to each other.

3. The memory device according to claim 2, wherein in the first direction, a length of the first global bit line sub-decoder block is less than or equal to a length of the first overhead projection area; in the first direction, a length of the second global bit line sub-decoder block is less than or equal to a length of the second overhead projection area.

4. The memory device according to claim 3, wherein in the first direction, the length of the first overhead projection area is equal to the length of the second overhead projection area.

5. The memory device according to claim 1, wherein the logic control circuit further comprises:
   a sense amplifier circuit electrically connected to an output terminal of the first global bit line sub-decoder and an output terminal of the second global bit line sub-decoder, and a sense amplifier circuit block formed by the sense amplifier circuit is located in at least one of the first overhead projection area or the second overhead projection area.

6. The memory device according to claim 5, wherein the sense amplifier circuit comprises:
   a first sense amplifier sub-circuit, electrically connected to the output terminal of the first global bit line sub-decoder, and a first sense amplifier sub-circuit block formed by the first sense amplifier sub-circuit is located in the first overhead projection area; and
   a second sense amplifier sub-circuit, electrically connected to the output terminal of the second global bit line sub-decoder, and a second sense amplifier sub-circuit block formed by the second sense amplifier sub-circuit is located in the second overhead projection area.

7. The memory device according to claim 1, wherein the logic control circuit further comprises:
   a first local bit line sub-decoder, the first local bit line sub-decoder comprises a first local bit line decoding unit and a second local bit line decoding unit electrically connected to the first global bit line sub-decoder; a first local bit line decoding unit block formed by the first local bit line decoding unit and a second local bit line decoding unit block formed by the second local bit line decoding unit are both located in the first overhead projection area; in the second direction, the first global bit line sub-decoder block is located between the first local bit line decoding unit block and the second local bit line decoding unit block.

8. The memory device according to claim 7, wherein the local bit line decoder further comprises:
   a second local bit line sub-decoder, the second local bit line sub-decoder comprising a third local bit line decoding unit and a fourth local bit line decoding unit electrically connected to the second global bit line sub-decoder; a third local bit line decoding unit block formed by the third local bit line decoding unit and a fourth local bit line decoding unit block formed by the fourth local bit line decoding unit are both located in the second overhead projection area; in the second direction, the second global bit line sub-decoder block is located between the fourth local bit line decoding unit block and the third local bit line decoding unit block.

9. The memory device according to claim 8, wherein in the second direction, the fourth local bit line decoding unit block, the third local bit line decoding unit block, the second local bit line decoding unit block, and the first local bit line decoding unit block are arranged in sequence; in the second direction, a distance between the first global bit line sub-decoder block and the second local bit line decoding unit block is less than a distance between the first global bit line sub-decoder block and the first local bit line decoding unit block; in the second direction, a distance between the second global bit line sub-decoder block and the third local bit line decoding unit block is less than a distance between the second global bit line sub-decoder block and the fourth local bit line decoding unit block.

10. The memory device according to claim 8, wherein the logic control circuit further comprises:
    a third word line decoding unit electrically connected to the second storage block, and a third word line decoding unit block formed by the third word line decoding unit is located in the second overhead projection area; and
    a fourth word line decoding unit electrically connected to the second storage block, and a fourth word line decoding unit block formed by the fourth word line decoding unit is located in the second overhead projection area;
    wherein in the first direction, a projection of the third word line decoding unit block and a projection of the fourth word line decoding unit block at least partially overlap; and the third word line decoding unit block and the fourth word line decoding unit block are both located between the second global bit line sub-decoder block and the fourth local bit line decoding unit block.

11. The memory device according to claim 8, wherein the first chip comprises N storage blocks sequentially arranged along the second direction, the first storage array comprises M storage blocks, and the second storage array comprises N-M storage blocks, wherein M is less than N, and both M and N are positive integers;
    the first overhead projection area is a projection area of an M-th storage block on the second chip, and the second overhead projection area is a projection area of an (M+1)-th storage block on the second chip;
    the first global bit line sub-decoder is electrically connected to at least one of the first local bit line decoding unit to 2M-th local bit line decoding unit, and the second global bit line sub-decoder is electrically connected to at least one of (2M+1)-th local bit line decoding unit to 2N-th local bit line decoding unit.

12. The memory device according to claim 11, wherein M is equal to N/2 after rounding; and the second global bit line sub-decoder block, a (2M+1)-th local bit line decoding unit block formed by the (2M+1)-th local bit line decoding unit, a 2M local bit line decoding unit block formed by a 2M local bit line decoding unit, and the first global bit line sub-decoder block are sequentially arranged adjacent to each other along the second direction.

13. The memory device according to claim 12, wherein the memory device further comprises:
    a plurality of first wirings, the plurality of first wirings are electrically connected to the first global bit line sub-decoder and the first local bit line decoding unit to the 2M-th local bit line decoding unit; and
    a plurality of second wirings, the plurality of second wirings are electrically connected to the second global bit line sub-decoder and the (2M+1)-th local bit line decoding unit to the 2N-th local bit line decoding unit.

14. The memory device according to claim 13, wherein in the second direction, a projection of the second sense amplifier sub-circuit block, a projection of the third word line decoding unit block, and/or a projection of the fourth word line decoding unit block do not overlap each other.

15. The memory device according to claim 7, wherein the logic control circuit further comprises:
    a first word line decoding unit electrically connected to the first storage block, and a first word line decoding unit block formed by the first word line decoding unit is located in the first overhead projection area; and
    a second word line decoding unit electrically connected to the first storage block, and a second word line decoding unit block formed by the second word line decoding unit is located in the first overhead projection area;
    wherein in the first direction, a projection of the first word line decoding unit block and a projection of the second word line decoding unit block at least partially overlap; the first word line decoding unit block and the second word line decoding unit block are both located between the first global bit line sub-decoder block and the first local bit line decoding unit block.

16. The memory device according to claim 15, wherein in the first direction, the first sense amplifier sub-circuit block is located between the first word line decoding unit block and the second word line decoding unit block; and in the second direction, the first sense amplifier sub-circuit block is located between the first global bit line sub-decoder block and the first local bit line decoding unit block.

17. The memory device according to claim 16, wherein in the first direction, a projection of the first sense amplifier sub-circuit block at least partially overlaps with a projection of the first word line decoding unit block and/or a projection of the second word line decoding unit block.

18. The memory device according to claim 17, wherein in the second direction, the projection of the first sense amplifier sub-circuit block, the projection of the first word line decoding unit block, and/or the projection of the second word line decoding unit block do not overlap each other.

\* \* \* \* \*